United States Patent [19]

Isobe et al.

[11] Patent Number: 4,963,221
[45] Date of Patent: Oct. 16, 1990

[54] HOT PRESS INCLUDING CAM ROD PENETRATING TOP PLATEN

[75] Inventors: Koukichi Isobe, Toukai; Masahiko Ogawa, Nagoya, both of Japan

[73] Assignee: Kabushiki Kaisha Meiki Seisakusho, Japan

[21] Appl. No.: 101,406

[22] Filed: Sep. 28, 1987

[30] Foreign Application Priority Data

Sep. 29, 1986 [JP] Japan .................. 61-230432
Sep. 30, 1986 [JP] Japan .................. 61-231696

[51] Int. Cl.⁵ .................. B30B 1/32; B30B 7/02; B30B 15/20
[52] U.S. Cl. .................. 156/358; 91/51; 100/48; 100/93 P; 100/269 R; 156/382; 156/583.1
[58] Field of Search ............ 156/358, 359, 580, 583.1, 156/583.6, 583.7, 228, 288, 382; 100/48, 93 P, 258 A, 270, 43, 193, 194, 195, 199, 269 R; 425/338, 149, 167; 91/51, 165

[56] References Cited

U.S. PATENT DOCUMENTS

| | | | |
|---|---|---|---|
| 2,558,796 | 7/1951 | Tapper | 100/199 |
| 3,050,777 | 8/1962 | Siempelkamp | 100/199 |
| 3,236,176 | 2/1966 | Fischer | 100/195 |
| 3,465,645 | 9/1969 | Mala | 91/51 |
| 3,538,814 | 11/1970 | Fisher | 91/51 |
| 4,356,763 | 11/1982 | Hagström | 100/48 |
| 4,576,092 | 3/1986 | Yamato | 100/93 P |
| 4,666,551 | 5/1987 | Soberay et al. | 156/580 X |

FOREIGN PATENT DOCUMENTS

| | | | |
|---|---|---|---|
| 2049726 | 4/1972 | Fed. Rep. of Germany | |
| 0019800 | 5/1984 | Japan | 100/48 |
| 9215299 | 12/1984 | Japan | |
| 2282911 | 12/1987 | Japan | 156/583.1 |
| 0729096 | 4/1980 | U.S.S.R. | 100/269 R |

*Primary Examiner*—Michael W. Ball
*Assistant Examiner*—Steven D. Maki
*Attorney, Agent, or Firm*—Oliff & Berridge

[57] ABSTRACT

The present invention relates to a hot press to manufacture a substrate in which a printed circuit is provided.

The hot press comprising at least one of vertically movable heating plates, a freely elevating movable platen which elevates the heating plates to press a plate to be treated between the heating plates, and a detecting means for detecting the movement of the uppermost heating plate when said uppermost heating plate starts to be elevated, in which the elevating speed of the movable platen is changed to a lower speed by a signal generated from the detecting device.

This low speed control is carried out as follows. Relief valves and direction control valves are provided at a primary side and secondary side, respectively, of a clamping cylinder into which a ram for elevating the movable platen is inserted, and due to the difference of pressures between the primary and secondary sides of the clamping cylinder, it is made possible to successively change the clamping force from zero by elevating the ram at low speed, thereby giving a desired clamping force to the ram.

4 Claims, 4 Drawing Sheets

HOT PRESS INCLUDING CAM ROD PENETRATING TOP PLATEN

BACKGROUND OF THE INVENTION

This invention relates to a hot press device for manufacturing a laminated structure, and more particularly to a hot press device for manufacturing a substrate of a printed circuit board. Still more particularly, the present invention relates to a hot press comprising a position detecting means for changing an elevating speed of a heating plate of the hot press from a high speed to a low speed immediately before clamping a plate to be treated; and in the pressure control of the hot press, an accurate pressure control is conducted during clamping at a low pressure.

The hot press device clamps a plurality of heating plates by way of elevating a ram of a clamping cylinder, while the intervals between heating plates are enlarged by lowering the ram. The plates which have been hot-pressed can be taken out by way of this enlargement of the intervals between the heating plates.

The elevating speed of the ram will now be described. Although this speed is preferably to be high for the purpose of shortening the time which is required to complete the work, high speed elevating of the ram after the clamping has started deteriorates the quality of a product because the adhesive which is interposed between layers of the laminates to be treated has not been sufficiently melted.

In order to overcome aforesaid problem, the conventional device adopts an arrangement as shown in FIG. 5. Namely, a limit switch supporting rod 103 is suspended from a side surface 101 of a top plate 100 of the hot press through a bracket 102. A limit switch 104 can be adapted to be secured to any desired portion of the aforesaid limit switch supporting rod 103. One end of a bracket 106 is secured to a side surface of a top heating plate 105 which moves vertically, while a cam 107 is secured to another end so as to energize the limit switch 104 by means of this cam 107. Heating plate 109 is fixedly secured to insulating plate 108, which is fixedly secured to plate 100. When the top heating plate of the hot press which moves vertically has come up to a predetermined position, a signal is generated so as to change the elevating speed of the heating plate to a low speed.

However, in the aforesaid mechanism, it is needed to adjust the position of the limit switch 104 along the limit switch supporting rod 103 so as to shift the position at which the elevating speed of the heating plate is changed to low, whenever the thickness of the plate to be treated is changed.

This hampers automation of preparatory work in a hot press device. Furthermore, such a position adjustment is very difficult in a vacuum hot press in which the outer circumference of the hot press is closed.

The change of the speed of the ram will now be described.

The speed of the ram is needed to be changed when the clamping of the heating plates starts as mentioned above.

The way to control the elevation of the ram is changed from the speed control mode to the pressure control mode.

That is, a hydraulic pressure in the clamping cylinder is adjusted by means of a pressure control valve so as to vary the pressure (kg/cm$^2$) which is applied to the plate to be hot-pressed, in accordance with a melting condition of a prepreg for the plate to be hot-pressed. However, the characteristics of the pressure control valve which is used for adjusting the pressure is very unstable when it is used in a low pressure range of substantially 0 kg/cm$^2$ to 10 kg/cm$^2$ For example, when a hot press provided with a single action clamping cylinder 30 shown in FIG. 6 is used, oil is led to flow into the clamping cylinder 30 by a pump for the purpose of elevating a ram 30a. When low pressure control is carried out for the purpose of adjusting the hydraulic pressure in the clamping cylinder 30 by means of the pressure control valve, the only possible way to be employed is to set the pressure control valve to operate at low pressure. However, as mentioned above, it is difficult for the pressure control valve to accurately control the pressure in a low pressure region. When press-forming a product of a thin thickness, it is required to clamp it with low pressure which meets the fusing degree of a prepreg of the product.

SUMMARY OF THE INVENTION

An object of the present invention is, therefore, to provide a hot press having a means for automatically detecting the position at which the elevating speed of the heating plate is changed from a high speed to a low speed when the heating plate is elevated to heat and press a plate to be treated without necessitating any adjustment of this position whenever a thickness of the plate to be treated is changed.

A further object of the present invention is to provide a means which is capable of controlling the clamping force of a hot press at a low force.

In order to achieve the aforesaid objects, a device according to the present invention is characterized in that a base body and a top plate are secured by means of a tie rod, and a plurality of heating plates are disposed between the base body and the top plate, the heating plates being adapted to open and close so as to clamp a plate to be treated and take out the finished product by way of a vertical movement of a movable platen. The heating plate adjacent to the lower surface of the top plate is adapted to be brought into and out of contact with the top plate. Further, it is provided a device for detecting an operation of the heating plate when each heating plate is elevated by way of the elevation of the movable platen and the heating plate which is adjacent to a lower surface of the top plate starts the elevation. The elevating speed of the movable platen is changed by a signal generated from this detecting device.

According to another aspect of the present invention, there is provided a hot press device which comprises heating plates disposed between a stationary platen and a movable platen which is movable with respect to the stationary platen, these heating plates being provided for the purpose of pressing and clamping a plate to be press formed, a double action clamping cylinder for driving the movable platen, an electromagnetic relief valve and a direction control valve which are provided in each of the primary passage and the secondary passage of this clamping cylinder, and a pressure control circuit which is capable of being driven at a low pressure to provide predetermined clamping force by the difference in pressure between the primary side passage and the secondary side passage. In hot-press operation, the clamping pressure is controlled by way of the difference in pressure of the electromagnetic relief valves which are disposed on the primary cylinder chamber and the secondary cylinder chamber, respectively. Therefore, the electromagnetic valves can be set to operate at suitable levels rather than low level which causes the aforesaid problems. With this arrangement, the clamping force can be kept at a desired low level, and the output can be also linearly controlled in the range between a low pressure and a high pressure.

BRIEF DESCRIPTION OF THE DRAWINGS

FIGS. 1 and 2 are front elevational views illustrating a device according to the present invention, wherein FIG. 1 illustrates a state in which adjacent heating plates are separated from each other, and FIG. 2 illustrates a state in which the heating plates are closed;

DETAILED DESCRIPTION OF THE PREFERRED EMBODIMENTS

Referring to the accompanying drawings, an embodiment according to the present invention will now be described.

Figure 1:
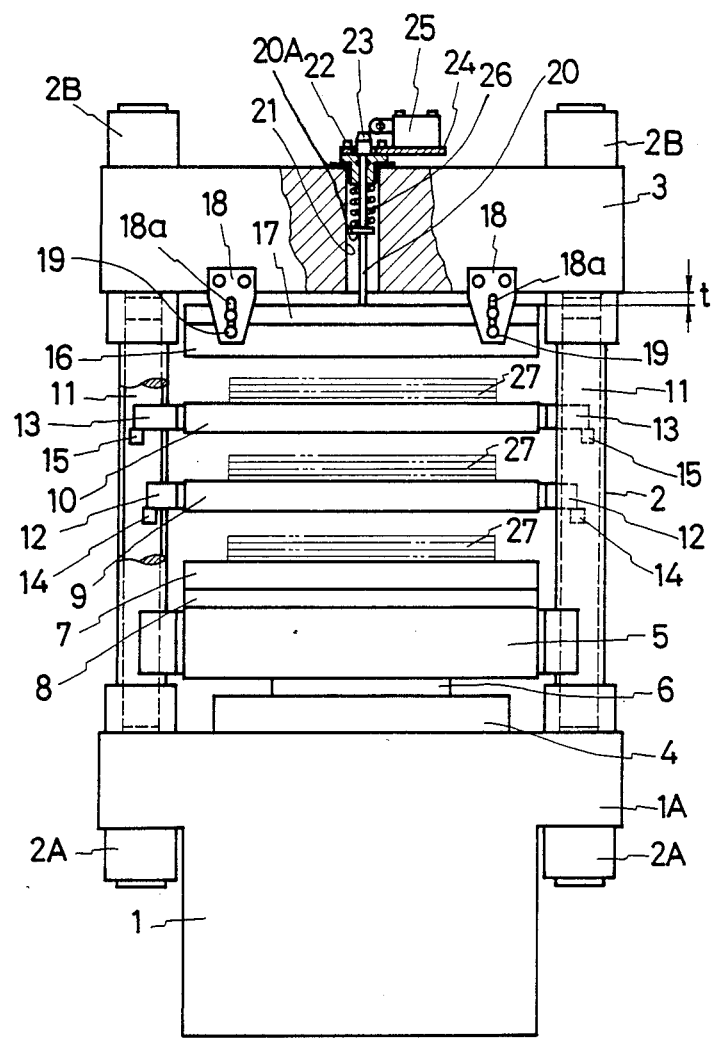
Figure 2:
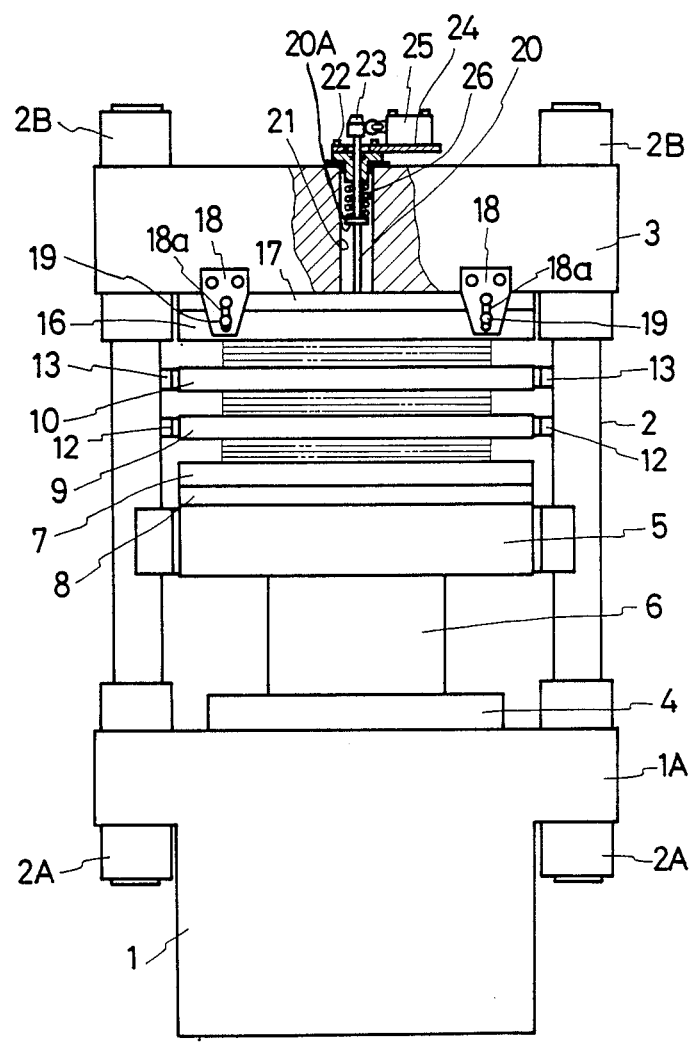

In FIGS. 1 and 2, reference numeral 1 is a base plate. Four tie rods 2 are uprightly provided on flanges 1A of the base plate 1. Each of the lower ends of the tie rods 2 is fastened to the base plate 1 by a nut 2A, while each of the upper ends thereof is fastened to a top plate 3 by a nut 2B. Reference numeral 4 represents a clamping cylinder, and reference numeral 5 represents a movable platen which is secured to a tip portion of a ram 6, the low portion of which is inserted into, and fitted with, the clamping cylinder 4. Reference numeral 7 represents a heating plate which is secured on the movable platen 5 through a heat insulating plate 8. Reference numerals 9 and 10 represent vertically movable heating plates. These heating plates 9 and 10 are moved vertically while the ends of claws 12 and 13 which are respectively secured to the heating plates 9 and 10 at four corners are guided by guide plates 11 which are uprightly provided at the four corners. Reference numerals 14 and 15 represent stoppers which determine a space between the heating plates 9 and 10, and are secured to predetermined positions on side surfaces of the guide plates 11. In this case, the lengths of the claws 12 and 13 are varied, and the stoppers 14 and 15 are arranged in such a manner that one stopper at the upper position is placed at an outside position from the other stopper at the lower position. Reference numeral 16 represents a heating plate to which a heat insulating plate 17 is secured. This heating plate is supported in such a manner that pins 19 secured to the heating plate 16 are respectively inserted into elongated holes of brackets 18 which are secured to four corners of the top plate 3 so as to be capable of being brought into contact with or separated from the top plate 3. Reference numeral 20 represents a cam rod which is uprightly provided with one end thereof secured at a center of the heating plate 16. The cam rod 20 penetrates into an opening 21 which is positioned at a central portion of the top plate 3. A spring seat 20A is provided on the cam rod 20 at a central portion of the latter and a cam 23 is secured at an upper end of the cam rod 20. Reference numeral 22 represents a limit switch securing ring a central portion of which the cam rod 20 penetrates so as to be vertically movable, and the limit switch securing ring 22 is secured to the top plate 3. Reference numeral 24 represents a bracket, one end of which is secured to the limit switch securing ring 22, and on which a limit switch 25 is mounted. Reference numeral 26 represents a spring, which is disposed between the spring seat 20A and the lower end of the limit switch securing ring 22 so as to constantly apply a downward spring force to the cam rod 20.

In this embodiment, plates to be treated which are respectively disposed on the heating plates are exposed to the atmosphere. When using this invention in vacuum type hot press which is air-tightly closed by the walls, however, a groove for an 'O' ring can be provided in the inner hole of the limit switch securing ring so as to meet the necessity of airtightness at the time of projecting the cam rod 20 through the top plate 3.

The operation will now be described. FIG. 1 illustrates the state wherein the movable plate 5 is lowered to the lower limit so as to mount plates 27 to be treated on the heating plates of the hot press, and the heating plates 9 and 10 are mounted on the stoppers 14 and 15 which are secured to the side surfaces of the guide plates 11 through the claws 13 and 14 in such a manner that a predetermined space is maintained between the heating plates 9 and 10. In this state, the heating plate 16 is suspended along the elongated holes 18a in the brackets 18, whereby a clearance t is formed between the lower surface of the top plate 3 and the heat insulating plate 17 secured on the heating plate 16.

Since the lower end of the cam rod 20 is secured to the heating plate 16, the cam rod 20 is in a lowered position, and the limit switch 25 is not therefore energized.

De-energization of the limit switch 25 can be ensured when the heating plates of the hot press are separated from each other by resilient force of the spring 26.

The plates to be treated 27 are then mounted on the heating plates 7, 9 and 10 at predetermined positions thereof and the movable platen 5 is then elevated by actuation of the clamping cylinder 4. In this case, an elevating speed $V_1$ of the movable platen 5 is high speed, the space between the heating plates becomes smaller, and the plate to be treated 27 placed on the heating plate 7 is first brought into contact with the lower surface of the heating plate 9 so as to elevate the heating plate 9. Then the upper heating plates are elevated step by step. When the heating plate 16 is elevated and the cam 23 at the top of the cam rod 20 energizes the limit switch 25 to generate a signal for the purpose of switching the elevating speed of the movable plate 5 is changed to low speed $V_2$. The plates to be treated 27 are started to be clamped at low speed, and the plates to be treated are clamped at a predetermined pressure. After the treatment is completed, the movable plate 5 is lowered, the space between the heating plates is kept at the predetermined spacing, and the finished plates are taken out.

In other words, according to the present invention, even if the thickness of the plates to be treated is changed, the contact of the plate to be treated with the lower surface of the heating plate 16, i.e., the elevating movement of the cam rod 20 secured to the heating plate 16 at its one end is detected by a limit switch 25, whereby a signal is generated. Consequently, it is not necessary to adjust the position of the limit switch 25 each time the thickness of the plates to be processed is changed. Hence the automation of the manufacturing process can be promoted.

In the case of a vacuum hot press, since the entire heating plates are hermetically sealed with a cover, with a conventional apparatus, it is difficult to set the position of changing over the elevating speed of the movable platen in view of its structure and operation. Therefore, the present invention displays an even greater effect when it is applied to the vacuum hot press.

Hereafter, description will be made of a hydraulic pressure mechanism which is applied to a pressure control system of the hot press mentioned above.

A heating plate of a hot press is heated up to 150 to 400 ° C. or thereabout by steam or electricity.

Figure 3:
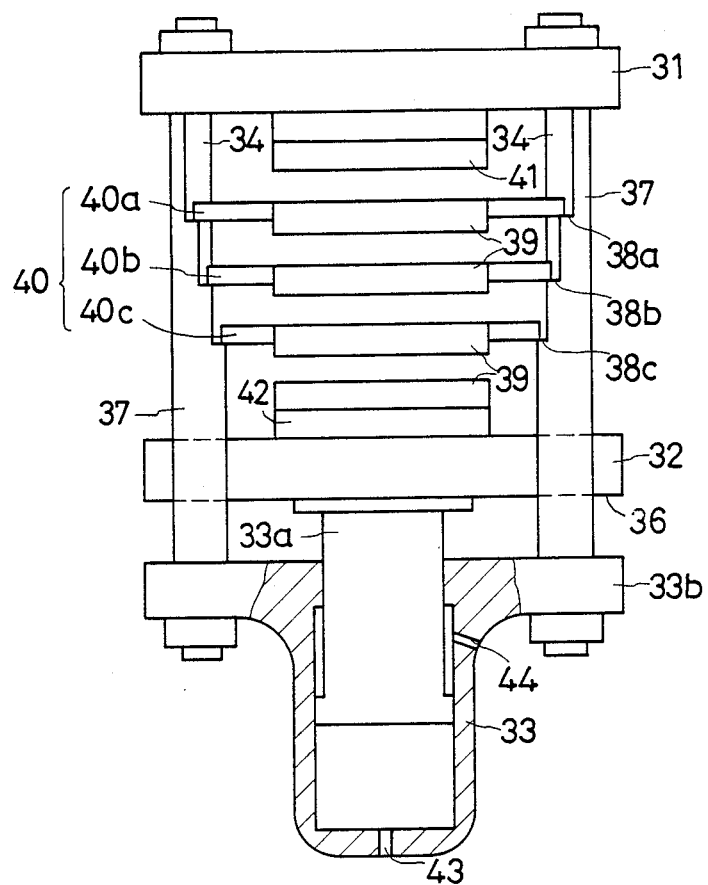
FIG. 3 is a front elevational view, partly in section, of a hot press according to the present invention.
Figure 6:
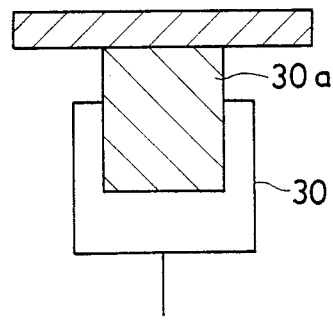
FIG. 6 is a cross sectional view illustrating a single action cylinder.

In FIG. 3, reference numeral 31 is a stationary platen, said stationary platen 31 being equivalent with the top plate 3 in FIGS. 1 and 2. The reference numeral 32 represents a movable platen and the reference numeral 33 represents a clamping cylinder. The stationary platen 31 and the flange of the clamping cylinder 33 are disposed with predetermined spacing therebetween.

The movable platen 32 is secured to a tip portion of a ram 33a which is inserted into a clamping cylinder 33, and which is arranged to be freely movable with respect to the stationary platen 31. The flange of the clamping cylinder 33 is provided with four supporting portions 33b extending horizontally. Tie rod 34 is uprightly provided on each supporting portion 33b. Each of the tie rods 34 is inserted into a corresponding through hole formed at the four corners of the movable platen 32. The stationary platen 31 is secured to the upper end of the tie rod 34.

The reference numeral 37 represents four step plates in the form of a step which are uprightly disposed at the flange of the clamping cylinder 33. The number of the step plates 37 depends on that of tie rod 34. Seating portions 38a, 38b and 38c are respectively provided vertically on the step plates 37 with a predetermined spacing therebetween.

A plurality of heating plates 39 are provided between the stationary platen 31 and the movable platen 32 so as to mount and press plates to be press-formed, such as printed circuit board and IC cards at four corners of the heating plate 39. Brackets 40 which are respectively mounted on the step plates 37 are provided at four corners of the heating plate 39. The brackets 40 are arranged in such a manner that brackets 40a, 40b and 40c are so mounted that their lengths are consecutively reduced starting with the upper heating plate 39 toward the lower plates in correspondence with seating portions 38a, 38b and 38c, respectively.

Heat insulating plates 41 and 42 are respectively secured to the lower surface of the aforesaid stationary platen 31 and the upper surface of the movable platen 32 for the purpose of insulating the heat conductance from the heating plate 39 to the stationary platen 31 or movable platen 32.

Figure 5:
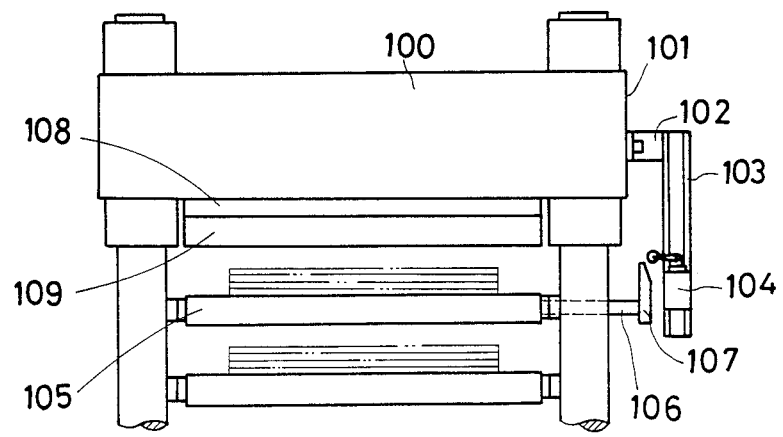
FIG. 5 is a front elevational view illustrating a hot press having a conventional heating plate position detecting device.

The characteristic structure of the present invention will now be described with reference to FIG. 5.

A clamping cylinder 33 shown in FIG. 3 is a double action hydraulic pressure cylinder, in which oil ports 43 and 44 are provided to supply and discharge the pressurized oil to and from the primary cylinder chamber and the secondary cylinder chamber, respectively.

A primary passage 47 and a secondary passage 48 for supplying the oil from corresponding hydraulic pressure pumps 45 and 46 are connected to the oil ports 43 and 44. A pair of by-pass passages 47a and 47b and a pair of by-pass passages 48a and 48b are respectively connected to the corresponding passages 47 and 48, and a 4-port 2-position direction control valves 49 and 50 are respectively provided in the bypass passages 47a and 48a for the hydraulic pressure pumps 45 and 46, and electromagnetic relief valves 51 and 52 are provided in the by-pass passages 47b and 48b of the oil ports 43 and 44.

In order to properly set the operation pressure of the respective electromagnetic relief valves 51 and 52, pressure sensors 53 are provided which feed back a pressure change corresponding to a load and the condition of the hydraulic pressure circuit, and which timely detect the pressures of the primary cylinder chamber and the secondary cylinder chamber of the clamping cylinder 33 at the time of operating.

The pressure control for the hydraulic pressure circuit according to the present invention will now be described.

On the basis of the diameters of the pistons in primary and the secondary chambers of the clamping cylinder, the operation pressure of each of the electromagnetic relief valves 51 and 52 is determined so as to attain predetermined levels of pressure in the primary and secondary chambers.

Hydraulic pressure outputs from the pumps 45 and 46 are respectively supplied to the clamping cylinder 33 through the passages 47 and 48 by energizing a solenoid P of the direction control valves 49 and 50.

The desired clamping force is obtained by attaining a predetermined difference in pressure between the primary side and the secondary chambers by setting the operation pressure of the electromagnetic relief valves 51 and 52 at predetermined levels.

The hydraulic pressure from the pump 45 is thus supplied to the clamping cylinder 33 through the oil port 43 in accordance with the set pressure of the electromagnetic relief valve 51, and a desired low pressure output can be thus kept.

By setting the operation pressure of the electromagnetic relief valve 52 in relation to the proper minimum set pressure of the electromagnetic relief valve 51, the electromagnetic relief valve 51 can linearly progressively change the pressure in the range in which it can effectively operate by its characteristic the range between the minimum set pressure and the maximum set pressure.

Figure 4:
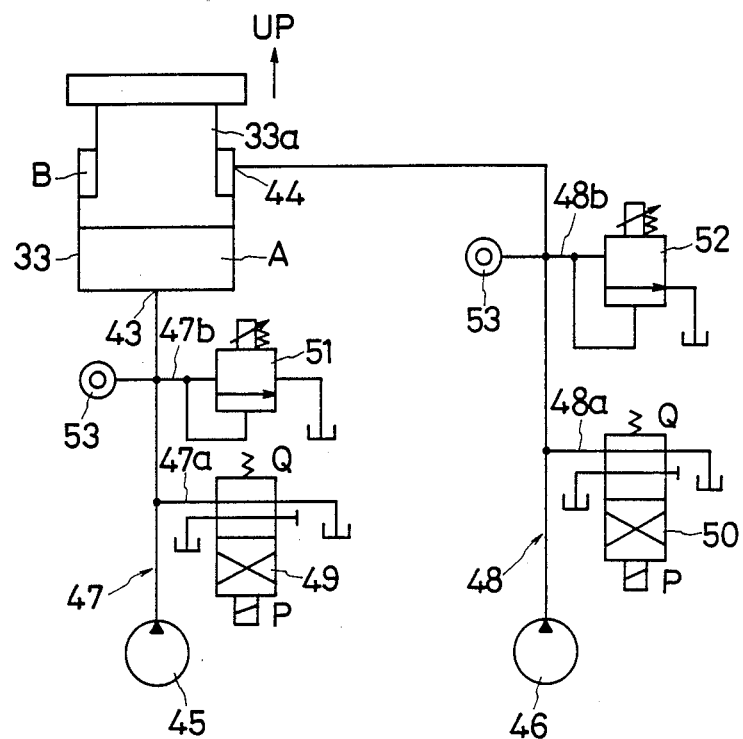
FIG. 4 is a pressure control circuit which is applied to the hot press shown in FIG. 3.

A practical example of aforesaid pressure control will now be described. In FIG. 4, a ram 33a has a large-diameter portion of a diameter $D_A$, and a small-diameter portion of a diameter $D_B$. The area of the ram 33a at a lower chamber A of the clamping cylinder 33, which is sectioned into upper and lower chambers by the ram 33a, is represented by $S_A$, while the area of the ram 33a at the upper chamber B is represented by $S_B$. The pressures of the electromagnetic relief valves 51 and 52 are respectively represented by $P_A$ and $P_B$. The outputs $F_A$ and $F_B$ of the ram 33a at respective chambers A and B, and clamping force $F_{AB}$ acting on the heating plate 39 of the ram 33a are determined.

As a specific value, diameters $D_A$ and $D_B$ of the ram 33a are respectively taken as 356 mm and 300 mm, while set pressures $P_A$ and $P_B$ of both electromagnetic relief valves 51 and 52 are taken as 10 kg/cm² and 35 kg/cm², respectively.

output $F_A$ of ram at chamber A  (i)

$$\text{area } S_A \text{ of ram 33a at chamber } A = \pi \times \left(\frac{D_A}{2}\right)^2$$
$$= \pi/4 \times (35.6 \text{ cm})^2$$
$$= 995.4 \text{ cm}^2$$

$$\text{output } F_A \text{ of ram 33a} = S_A \cdot P_A$$
$$= 995.4 \text{ cm}^2 \times 10 \text{ kg/cm}^2$$
$$= 9954 \text{ kg}$$
$$\approx 10 \text{ tons}$$

output $F_B$ of ram at chamber B  (ii)

$$\text{area } S_B \text{ of ram 33a at chamber } B = \pi \times (D_A/2)^2 - \pi (D_B/2)^2$$
$$= \pi/4\{(D_A/2)^2 - (D_B/2)^2\}$$
$$= \pi/4\{(35.6 \text{ cm})^2 - (30 \text{ cm})^2\}$$
$$= 288.5 \text{ cm}^2$$

$$\text{output } F_B \text{ of ram 33a} = S_B \cdot P_B$$
$$= 288.5 \text{ cm}^2 \times 35 \text{ kg/cm}^2$$
$$= 10097.5 \text{ kg} \approx 10 \text{ tons}$$

clamping force $F_{AB}$ of ram  (iii)

$$F_{AB} = F_A - F_B$$
$$= 10 \text{ tons} - 10 \text{ tons}$$
$$= 0 \text{ ton}$$

That is, the clamping force of the ram 33a with respect to the heating plate 39 can be reduced to zero in this invention. Furthermore, the zero clamping force can be stably maintained.

This clamping force can be progressively increased in a manner which will be described hereinbelow.

In this case, the progressive increase of the clamping force can be achieved only by gradual increase in the difference in pressure from zero between output $F_A$ and $F_B$ of ram 33a. Specifically, the set pressure of the electromagnetic relief valves 52 is kept at $P_B$=35 kg/cm², and the set pressure $P_A$ of the electromagnetic relief valve 51 is increased from 10 kg/cm² in the similar manner as mentioned above.

The following table shows the outputs $F_A$, $F_B$ of the ram 33a and the clamping force $F_{AB}$ when the set pressure $P_A$ of the electromagnetic relief valve 51 is changed from 10 kg/cm² to 15 kg/cm², 20 kg/cm², 25 kg/cm²..

The formulas are same as those mentioned above.

| $P_A$ (kg/cm²) | $F_A$ (ton) | $F_B$ (ton) | $F_{AB}$ (ton) |
|---|---|---|---|
| 10 | 10 | 10 | 0 |
| 15 | 15 | 10 | 5 |
| 20 | 20 | 10 | 10 |
| 25 | 25 | 10 | 15 |
| . | . | . | . |
| . | . | . | . |
| . | . | . | . |

As mentioned above, the clamping force can be changed from zero to any desired level in this invention.

When press-forming an IC card, the clamping force of the ram 33a of the clamping cylinder 33 is kept at a low value till the adhesive resin is uniformly fused. After the adhesive resin has been uniformly fused, the clamping force is increased, and press forming is conducted so as to prevent any overflow of the thermally set adhesive resin from the portion between the card plates.

Then the ram 33a of the clamping cylinder is lowered by shifting the position of the direction control valve 49 to Q so as to return the pressurized oil in the primary side to a chamber. If the lowering speed is too high, an orifice valve is employed for adjustment.

The pressure sensors 53 shown in FIG. 4 are used so as to detect the primary pressure and secondary pressure of the clamping cylinder 33, and a control circuit which is provided so as to feedback the pressure to vary the set pressure of the electromagnetic relief valves 51 and 52, whereby a further suitable pressure can be obtained.

Although this invention employs the hydraulic pressure, other types of pressure source, for example, pneumatic source or the like can be employed so as to perform similar operation.

The conventional hot press in which a clamping force is remarkably larger with respect to the size of the heating plate necessitates an individual lowering exclusive cylinder, but according to the present invention, such an exclusive cylinder is not needed because the ram can be easily and speedily lowered by the direction control valve.

As many apparently widely different embodiments of this invention may be made without departing from the spirit and scope thereof, it is to be understood that the invention is not limited to the specific embodiments thereof except as defined in the appended claims.

What is claimed is:

1. A hot press which is provided with a base platen, a top platen supported by a plurality of tie rods fixed uprightly on said base platen, a movable platen guided movably by said tie rods, at least one hydraulic cylinder for elevating or lowering said movable platen, at least two heating plates guided movably between said top platen and movable platen and means for maintaining a predetermined space between each adjacent heating plate when said movable platen is positioned at a lowest limit, comprising:

a top heating plate hung movably down from said top platen by support means, a cam rod moving in cooperation with movement of said top heating plate and penetrating through said top platen, means for detecting a start of elevation of said top heating plate by an electric means mounted on the top platen for detecting the motion of said cam rod and generating a signal for switching a control of said hydraulic cylinder from a speed control to a pressure control.

2. A hot press as claimed in claim 1, wherein space between said platen and said top platen hermetically closed so as to form a vacuum chamber, and said heating plates are disposed in said vacuum chamber.

3. A hot press as claimed in claim 1, wherein said support means comprises a plurality of brackets with elongated holes and a plurality of brackets with elongated holes and a plurality of pins secured to the side surface of said top heating plate which are inserted into said elongated holes.

4. A hot press which is provided with a base platen, a top platen supported by a plurality of tie rods fixed uprightly on said base platen, a movable platen guided movably by said tie rods, at least one hydraulic cylinder for elevating or lowering said movable platen, at least two heating plates guided movably between said to platen and movable platen, a double action clamping cylinder including a primary and a secondary cylinder chamber for operating said movable platen and means for maintaining a predetermined space between each adjacent heating plate when said movable platen is positioned at a lowest limit, comprising:

- a top heating plate hung movably down from said top platen by support means;
- a cam rod moving in cooperation with movement of said top heating plate and penetrating through said top platen;
- means for detecting a start of elevation of said top heating plate by an electric means mounted on the top platen for detecting the motion of said cam rod and generating a signal for switching a control of said hydraulic cylinder from a speed control to a pressure control;
- a pressure control circuit for generating clamping pressure by difference in pressure between said primary and secondary cylinder chamber, wherein said pressure control circuit comprises:

- two pumps which deliver a pressurized hydraulic medium to the primary and secondary cylinder chambers of said double action clamping cylinder;
- a primary passage between said primary cylinder chamber and one of said two pumps;
- a secondary passage between said secondary cylinder chamber and the other of said two pumps;
- a relief valve and a directional valve which are both included as part of said primary passage;
- a second relief valve and a second directional valve which are both included as part of said secondary passage, wherein said primary and secondary passage are provided independently of each other and one of the pumps delivers the pressurized hydraulic medium to only the primary chamber and the other pump delivers the pressurized hydraulic medium to only the secondary chamber.

* * * * *